United States Patent
Hiroyama et al.

(10) Patent No.: US 6,914,274 B2
(45) Date of Patent: Jul. 5, 2005

(54) THIN-FILM SEMICONDUCTOR EPITAXIAL SUBSTRATE HAVING BORON CONTAINING INTERFACE LAYER BETWEEN A COLLECTOR LAYER AND A SUB-COLLECTOR LAYER

(75) Inventors: Yuichi Hiroyama, Kusatsu (JP); Tomoyuki Takada, Austin, TX (US); Osamu Ichikawa, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/394,068

(22) Filed: Mar. 24, 2003

(65) Prior Publication Data

US 2003/0197185 A1 Oct. 23, 2003

(30) Foreign Application Priority Data

Apr. 19, 2002 (JP) ...................................... 2002-118444

(51) Int. Cl.⁷ ............................................ H01L 29/737
(52) U.S. Cl. ...................................... 257/197; 257/200
(58) Field of Search .............................. 257/79, 85, 90, 257/94, 183, 190, 192, 194, 196, 197, 200, 11, 12, 96, 189, 477, 526, 565, 552, 563; 438/170, 173, 234–235, 309, 312, 597, 604, 606

(56) References Cited

U.S. PATENT DOCUMENTS 6,531,721 B1 * 3/2003 Burton et al. ............... 257/197
6,750,480 B2 * 6/2004 Welser et al. ............... 257/183

FOREIGN PATENT DOCUMENTS

| JP | 2000-124444 | * | 4/2000 | ........... H01L/29/73 |
| JP | 2000-323493 A | | 11/2000 | |
| JP | 2001-176880 | * | 6/2001 | ........... H01L/29/73 |
| JP | 2001-203217 A | | 7/2001 | |
| JP | 2001-230262 | * | 8/2001 | ........... H01L/29/73 |
| JP | 2001-326283 | * | 11/2001 | ....... H01L/21/8222 |
| JP | 2002-026031 | * | 1/2002 | ........... H01L/29/73 |
| JP | 2002-299603 | * | 10/2002 | ......... H01L/29/737 |
| JP | 2002-359249 | * | 12/2002 | ......... H01L/29/737 |
| JP | 2003-115495 | * | 4/2003 | ......... H01L/29/737 |

OTHER PUBLICATIONS

Y.F. Yang et al., A GaInP/GaAs HBT with a Selective Buried Sub–Collector Layer Grown by MOCVD. IEEE 1996, pp. 34–35.*
J.J. Liou et al., Base and Collector Leakage Currents and Their Relevance to the Reliability of AlGaAs/GaAs Heterojunction Bipolar Transistors. IEEE 1994, pp. 446–453.*
A. Girardot et al., High–Performance Collector–up InGaP/GaAs Heterojunction Bipolar Transistor with Schottky Contact. Electronics Letters 1999, vol. 35, No. 8, pp. 670–672.*
C.M. Wang et al., High Linearity InGasP/GaAs Power HBTs by Collector Design. IEEE 2004, pp. 58–60.*

* cited by examiner

*Primary Examiner*—Anh Duy Mai
(74) *Attorney, Agent, or Firm*—Birch, Stewart, Kolasch & Birch, LLP

(57) ABSTRACT

A thin-film semiconductor epitaxial substrate comprising a substrate and a sub-collector layer, a collector layer, a base layer and an emitter layer(s) which are formed as thin-film semiconductor epitaxial layers on said substrate, wherein boron (B) added is present in at least a part of a layer portion comprising said sub-collector layer and said collector layer.

17 Claims, 1 Drawing Sheet

THIN-FILM SEMICONDUCTOR EPITAXIAL SUBSTRATE HAVING BORON CONTAINING INTERFACE LAYER BETWEEN A COLLECTOR LAYER AND A SUB-COLLECTOR LAYER

BACKGROUND OF THE INVENTION (1) Field of the Invention

The present invention relates to a thin-film semiconductor epitaxial substrate suitable for producing a hetero-junction bipolar transistor (HBT) and a process for producing the thin-film semiconductor epitaxial substrate.

(2) Description of the Related Art

As a semiconductor element used in a region of frequencies higher than that of microwave, a high-performance hetero-junction bipolar transistor (HBT) is produced by using a recent excellent crystal growth technique such as MOCVD. HBT is composed as follows: a material having a larger band gap than a base layer is used as an emitter layer to make emitter-base junction as hetero junction, and an energy barrier at the time when holes flow into the emitter layer from the base layer is heightened as compared with a homo-junction bipolar transistor so that holes can be prevented from flowing into the emitter, whereby the emitter injection efficiency is improved.

The current amplification mechanism of conventional HBT composed as described above is fundamentally the same as that of a conventional homo-junction bipolar transistor. Accordingly, the probability of the recombination of electrons and holes in the base region should be lessened in order to improve the current amplification factor. Therefore, the following structure, for example, has been well known: AlGaAs with a compositional gradient is used in the emitter layer and base layer so that an electric field for accelerating electrons is produced, and the flow of electrons in the base region is accelerated by the synergistic effect of a conventional type of flow due to diffusion caused by the concentration gradient of electrons and a flow due to the transit of electrons caused by the electric field produced in AlGaAs crystals, to reduce the transit time of electrons in the base region, whereby the probability of the recombination of electrons and holes in the base region is lessened.

In addition, an attempt has been made to improve the crystallinity of the emitter layer and the base layer or the boundary surface between them in order to improve the current amplification factor of HBT. The relationship between the crystallinity of a collector layer or a sub-collector layer and the current amplification factor, however, has not sufficiently been investigated.

However, it has recently been found that the carrier concentration in a sub-collector layer, i.e. a thin layer with a high electric conductivity formed between a collector layer and a collector electrode in order to reduce the contact resistance between them, affects the current amplification factor remarkably. In designing a semiconductor device, it is desirable that the carrier concentration in the sub-collector layer can be freely set. However, when the carrier concentration affects the current amplification factor remarkably, the degree of freedom of the design of the device is severely limited, so that the design of a device having desirable characteristics is complicated.

SUMMARY OF THE INVENTION

An object of the present invention is to provide a thin-film semiconductor epitaxial substrate that permits solution of such problems in the prior art, and a process for producing the thin-film semiconductor epitaxial substrate.

Another object of the present invention is to provide a thin-film semiconductor epitaxial substrate that permits reduction of the influence of the carrier concentration in a sub-collector layer on the current amplification factor, and a process for producing this thin-film semiconductor epitaxial substrate.

Still another object of the present invention is to provide a thin-film semiconductor epitaxial substrate that permits production of a highly reliable semiconductor device, and a process for producing this thin-film semiconductor epitaxial substrate.

In the present invention, in order to solve the above problems, in producing a thin-film semiconductor epitaxial substrate for HBT production by forming a sub-collector layer, a collector layer, a base layer and an emitter layer(s) on a substrate by gas phase crystal growth, the step of adding boron (B) to at least a part of a layer portion comprising the sub-collector layer and the collector-layer is incorporated into the production process of the thin-film semiconductor epitaxial substrate. Therefore, in the thin-film semiconductor epitaxial substrate thus produced, the boron (B) added is present, for example, in at least a part of the sub-collector layer or the collector layer, or near the boundary surface between the sub-collector layer and the collector layer.

When the boron (B) added is thus present in at least a part of a layer portion comprising the sub-collector layer and the collector layer, composite crystal defects caused in the sub-collector layer by doping of the sub-collector layer with a high concentration of a dopant are inhibited from propagating into the base layer and the emitter layer(s). As a result, the composite crystal defects caused in the sub-collector layer can be effectively prevented from becoming a recombination center in the base layer and the emitter layer(s) to increase the base current and lower the current amplification factor. Therefore, even when the sub-collector layer is doped with a high concentration of a dopant, the influence of the doping on the current amplification factor can be curbed to prevent the lowering of the current amplification factor, and at the same time, the reliability of a semiconductor device can be improved.

According to the first embodiment of the present invention, there is provided a thin-film semiconductor epitaxial substrate comprising a substrate and a sub-collector layer, a collector layer, a base layer and an emitter layer(s) which are formed as thin-film semiconductor epitaxial layers on said substrate, wherein boron (B) added is present in at least a part of a layer portion comprising said sub-collector layer and said collector layer.

According to the second embodiment of the present invention, there is provided a thin-film semiconductor epitaxial substrate according to the above first embodiment, wherein a portion containing said boron (B) added is formed in the form of a thin-film semiconductor epitaxial layer near the boundary surface between said collector layer and said sub-collector layer.

According to the third embodiment of the present invention, there is provided a process for producing a thin-film semiconductor epitaxial substrate comprising a substrate and a sub-collector layer, a collector layer, a base layer and an emitter layer(s) which are formed as thin-film semiconductor epitaxial layers on said substrate, which process is characterized by comprising the step of adding boron (B) to at least a part of a layer portion comprising said sub-collector layer and said collector layer.

According to the fourth embodiment of the present invention, there is provided a process for producing a thin-film semiconductor epitaxial substrate according to the above third embodiment, wherein a material for boron (B) is added for a predetermined period during growth of said layer portion to carry out the addition of boron (B).

According to the fifth embodiment of the present invention, there is provided a process for producing a thin-film semiconductor epitaxial substrate according to the above third or fourth embodiment, wherein triethylboron is used as said material for boron (B).

According to the sixth embodiment of the present invention, there is provided a hetero-junction bipolar transistor comprising a thin-film semiconductor epitaxial substrate according to the above first or second embodiment.

PREFERRED EMBODIMENT OF THE INVENTION

Figure 1:
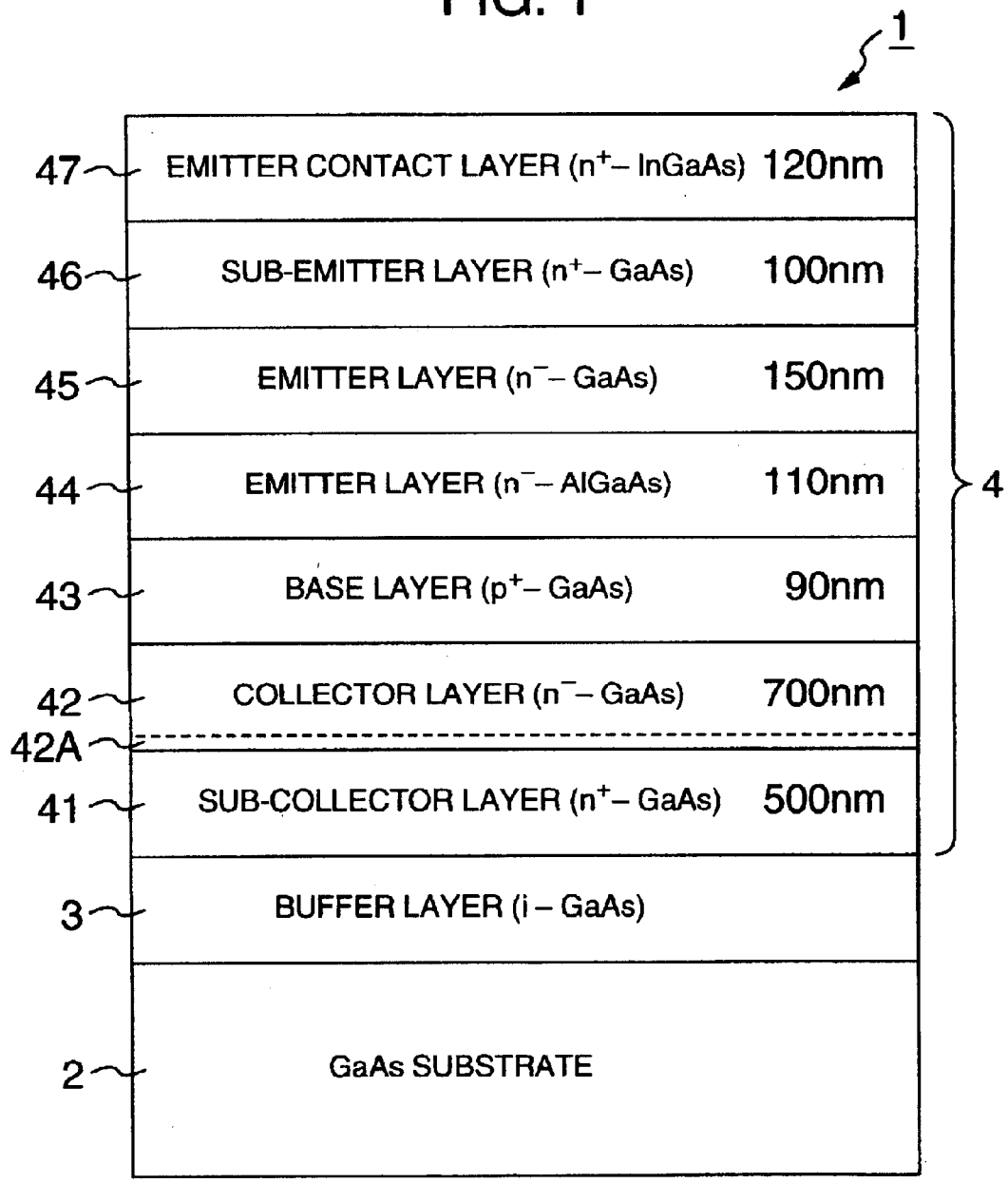
FIG. 1 is a cross-sectional view showing one embodiment of the thin-film semiconductor epitaxial substrate of the present invention.

One embodiment of the present invention is explained below in detail with reference to the drawing.

FIG. 1 is a schematic view showing a layer structure as one example of thin-film semiconductor epitaxial substrate for HBT produced by the process of the present invention. The thin-film semiconductor epitaxial substrate 1 is for producing GaAs-based HBT. The thin-film semiconductor epitaxial substrate 1 shown as one embodiment of the present invention is explained below.

The structure of the thin-film semiconductor epitaxial substrate 1 shown in FIG. 1 is as follows: The thin-film semiconductor epitaxial substrate 1 is constructed by laminating a plurality of semiconductor thin-film crystal growth layers one after another on a GaAs substrate 2 of semi-insulating GaAs compound semiconductor crystals by a MOCVD method as explained below. The GaAs substrate 2 is composed of a semi-insulating GaAs (001) layer, and in addition, a buffer layer 3 composed of an i-GaAs layer is formed on the GaAs substrate 2.

A HBT functional layer 4 is formed on the buffer layer 3. The HBT functional layer 4 is composed of layers formed as follows: An n$^+$-GaAs layer (carrier concentration: 3×10$^{18}$ to 5×10$^{18}$ cm$^{-3}$) capable of functioning as a sub-collector layer 41 is formed in a thickness of 500 nm on the buffer layer 3. In addition, an n$^-$-GaAs layer (carrier concentration: 1×10$^{16}$ cm$^{-3}$) capable of functioning as a collector layer 42 is formed in a thickness of 700 nm on the sub-collector layer 41. These two layers are formed as semiconductor epitaxial growth crystal layers.

In this case, boron (B) added is present in a portion of the collector layer 42 which is in contact with the sub-collector layer 41, whereby a B-containing layer 42a is formed in the collector layer 42. In the embodiment shown in FIG. 1, the thickness of the B-containing layer 42a is 10 nm. The B-containing layer 42a can be formed in the form of a thin-film semiconductor epitaxial layer, containing boron (B), by feeding triethylboron (TEB) as a material for boron (B) into a reactor together with arsine and trimethylgallium (TMG), i.e., starting gases necessary for forming the collector layer 42, only for a predetermined period from the start of growth of the collector layer 42 to the time when its thickness reaches 10 mm.

A p$^+$-GaAs layer (carrier concentration: 2×10$^{19}$ cm$^{-3}$) capable of functioning as a base layer 43 is formed as a semiconductor epitaxial growth crystal layer in a thickness of 90 nm on the collector layer 42. An n$^{31}$-AlGaAs layer (carrier concentration: 5×10$^{17}$ cm$^{-3}$) capable of functioning as an emitter layer 44 is formed in a thickness of 110 nm on the base layer 43. An n$^-$-GaAs layer (carrier concentration: 1×10$^{17}$ cm$^{-3}$) capable of functioning as an emitter layer 45 is formed in a thickness of 150 nm on the emitter layer 44. An n$^+$-GaAs layer (carrier concentration: 3×10$^{18}$ cm$^{-3}$) capable of functioning as a sub-emitter layer 46 is formed in a thickness of 100 nm on the emitter layer 45. An n$^+$-InGaAs layer (carrier concentration: 4×10$^{19}$ cm$^{-3}$) capable of functioning as an emitter contact layer 47 is formed in a thickness of 120 nm on the sub-emitter layer 46.

The thin-film semiconductor epitaxial substrate 1 shown in FIG. 1 is characterized in that the B-containing layer 42A is formed in a part of the collector layer 42. By thus forming the B-containing layer 42A, i.e., a layer region containing boron (B) added, in the collector layer 42, composite crystal defects caused in the sub-collector layer 41 by doping of the sub-collector layer 41 with a high concentration of a dopant are inhibited from propagating into the base layer 43 and the emitter layers 44 and 45. As a result, the composite crystal defects caused in the sub-collector layer 41 can be effectively prevented from becoming a recombination center in the base layer 43 and the emitter layers 44 and 45 to increase the base current and lower the current amplification factor. Therefore, in the case of HBT produced by the use of the thin-film semiconductor epitaxial substrate 1, even when the sub-collector layer 41 is doped with a high concentration of a dopant, the influence of the doping on the current amplification factor can be curbed to prevent the lowering of the current amplification factor of the HBT, and at the same time, the reliability of the HBT can be improved.

In order to investigate the difference between current amplification factor characteristics attained in the case of the layer structure of the thin-film semiconductor epitaxial substrate 1 having the B-containing layer 42A shown in FIG. 1 and those attained in the case of a thin-film semiconductor epitaxial substrate obtained by forming the collector layer 42 without forming the B-containing layer 42A, samples of these thin-film semiconductor epitaxial substrates of the respective case were produced.

Sample A

A MOCVD method was adopted for the following growths. After completion of the growth of the sub-collector layer 41, triethylboron (TEB) was fed together with starting gases of arsine and TMG at and after the start of the growth of the collector layer 42 to grow the B-containing layer 42A to a thickness of 10 nm. Then, only the feed of TEB was stopped and an n$^-$-GaAs layer was grown to a thickness of 680 nm. Thus, the collector layer 42 was formed which had the B-containing layer 42A of 10 nm thick in its portion that was in contact with the sub-collector layer 41, to produce sample A of the thin-film semiconductor epitaxial substrate having the layer structure shown in FIG. 1.

Sample B

After the growth of the sub-collector layer 41, a collector layer 42 having no B-containing layer 42A was formed by growing an n$^-$-GaAs layer to a thickness of 700 nm without feeding TEB. There was produced sample B of the same thin-film semiconductor epitaxial substrate as in the case of sample A except for not having the B-containing layer 42A.

Each of sample A and sample B was processed into HBT each having an emitter size of 100 $\mu$m×100 nm, followed by measurement of the current amplification factor at an electric current density of 1 kA/cm². The current amplification factor of the HBT (B) produced by the use of sample B having no B-containing layer 42A was 50. On the other hand, it was confirmed that the current amplification factor of the HBT (A) produced by the use of sample A having the B-containing layer 42A was as very large as 89.

The concentration of boron (B) added in the B-containing layer 42A of the aforesaid sample A was $6 \times 10^{18}$ cm$^{-3}$ as measured by secondary ion mass spectrometry.

In the above embodiment, the B-containing layer 42A was formed as the lower portion of 10 nm thick of the collector layer 42. However, considering the cause for lowering of the current amplification factor, it is conjectured that the same effect as described above can be obtained wherever the B-containing layer 42A may be formed between the sub-collector layer 41 and the base layer 43, namely, in the collector layer 42 region.

In the above embodiment, boron (B) was added to the collector layer 42 in order to reduce the diffusion of vacancy from the sub-collector layer 41 to the base layer 43. However, the same effect as obtained by this addition is expected to be obtained also by adding boron (B) to at least a part of the emitter layer 44, the emitter layer 45 or the sub-emitter layer 46. In this case, boron (B) can be added in the same manner as in the above embodiment.

According to the present invention, in producing a thin-film semiconductor epitaxial substrate for HBT production by forming a sub-collector layer, a collector layer, a base layer and an emitter layer(s) on a substrate by gas phase crystal growth as described above, the step of adding boron (B) to at least a part of a layer portion comprising the sub-collector layer and the collector layer is incorporated into the production process of the thin-film semiconductor epitaxial substrate. Therefore, in the thin-film semiconductor epitaxial substrate thus produced, the boron (B) added is present, for example, in at least a part of the sub-collector layer or the collector layer, or near the boundary surface between the sub-collector layer and the collector layer. Accordingly, composite crystal defects caused in the sub-collector layer by doping of the sub-collector layer with a high concentration of a dopant are inhibited from propagating into the base layer and the emitter layer(s). As a result, the composite crystal defects caused in the sub-collector layer can be effectively prevented from becoming a recombination center in the base layer and the emitter layer(s) to increase the base current and lower the current amplification factor. Therefore, even when the sub-collector layer is doped with a high concentration of a dopant, the influence of the doping on the current amplification factor can be curbed to prevent the lowering of the current amplification factor, and at the same time, the reliability of a semiconductor device can be improved.

It should be further understood by those skilled in the art that although the foregoing explanation of the present invention has been given by taking the case of the embodiment shown in FIG. 1, the invention is not limited thereto and various changes and modifications may be made without departing from the spirit of the invention and the scope of the appended claims. For example, although the present invention is explained above in the case of AlGaAs-based HBT, the present invention is not limited in application to AlGaAs-based HBT but can be applied to a thin-film semiconductor epitaxial substrate for producing InGaP-based HBT, in the same manner as above to bring about the same effect as above.

What is claimed is:

1. A thin-film semiconductor epitaxial substrate comprising a substrate and a sub-collector layer, a collector layer, a base layer and an emitter layer(s) which are formed as thin-film semiconductor epitaxial layers on said substrate, wherein boron (B) added is present in at least a part of a layer portion comprising said sub-collector layer and said collector layer.

2. The thin-film semiconductor epitaxial substrate according to claim 1, wherein a portion containing said boron (B) added is formed in the form of a thin-film semiconductor epitaxial layer near a boundary surface between said collector layer and said sub-collector layer.

3. A hetero-junction bipolar transistor comprising a thin-film semiconductor epitaxial substrate according to claim 1 or 2.

4. The thin film semiconductor material according to claim 1, wherein said collector layer and/or said sub-collector layer is GaAs.

5. The thin film semiconductor material according to claim 2, wherein said collector layer and/or said sub-collector layer is GaAs.

6. The thin film semiconductor material according to claim 1, wherein said sub-collector layer is an n$^+$-GaAs layer.

7. The thin film semiconductor material according to claim 1, wherein said collector layer is an n$^-$-GaAs layer.

8. The thin film semiconductor material according to claim 1, wherein said sub-collector layer is an n$^+$-GaAs layer having a carrier concentration of $3 \times 10^{18}$ to $5 \times 10^{18}$ cm$^{-3}$.

9. The thin film semiconductor material according to claim 1, wherein said collector layer is an n$^-$-GaAs layer having a carrier concentration of $1 \times 10^{16}$ cm$^{-3}$.

10. The thin film semiconductor material according to claim 1, wherein the collector layer has a thickness of 700 nm.

11. The thin film semiconductor material according to claim 1, wherein said thin-film semiconductor epitaxial layer near a boundary surface between said collector layer and said sub-collector layer has a thickness of 10 nm.

12. The thin film semiconductor material according to claim 1, wherein the substrate is a semi-insulating GaAs (001) layer.

13. The thin film semiconductor material according to claim 1, which further comprises an i-GaAs buffer layer formed between the substrate and the sub-collector layer.

14. The thin film semiconductor material according to claim 1, wherein the base layer is a p$^+$-GaAs layer having a carrier concentration of $2 \times 10^{19}$ cm$^{-3}$.

15. The thin film semiconductor material according to claim 1, wherein the emitter layer is an n$^-$-GaAs layer having a carrier concentration of $1 \times 10^{17}$ cm$^{-3}$.

16. The thin film semiconductor material according to claim 1, which further comprises an n$^+$-GaAs sub-emitter layer over the emitter layer.

17. The thin film semiconductor material according to claim 16, which further comprises an n$^+$-In GaAs emitter contact layer over the sub-emitter layer.

* * * * *